United States Patent
Schmutzler et al.

(10) Patent No.: US 7,339,307 B2
(45) Date of Patent: *Mar. 4, 2008

(54) SEALING ARRANGEMENT FOR A PIEZO ACTUATOR OF A FUEL INJECTOR

(75) Inventors: Gerd Schmutzler, Kareth (DE); Marcus Unruh, Zeitlarn (DE)

(73) Assignee: Siemens Aktiengesellschaft, Munich (DE)

( * ) Notice: Subject to any disclaimer, the term of this patent is extended or adjusted under 35 U.S.C. 154(b) by 362 days.

This patent is subject to a terminal disclaimer.

(21) Appl. No.: 10/961,319

(22) Filed: Oct. 8, 2004

(65) Prior Publication Data

US 2006/0037579 A1    Feb. 23, 2006

Related U.S. Application Data

(60) Provisional application No. 60/603,290, filed on Aug. 20, 2004.

(30) Foreign Application Priority Data

Aug. 20, 2004 (DE) ...................... 10 2004 040 491
Sep. 24, 2004 (EP) .................................. 04104652

(51) Int. Cl.
  *H01L 41/053*    (2006.01)
(52) U.S. Cl. ...................... 310/344; 310/340
(58) Field of Classification Search ................ 310/340, 310/344, 348
See application file for complete search history.

(56) References Cited

U.S. PATENT DOCUMENTS

| | | | |
|---|---|---|---|
| 6,274,967 B1 * | 8/2001 | Zumstrull et al. | 310/328 |
| 6,390,593 B1 * | 5/2002 | DeRoos et al. | 347/31 |
| 7,059,170 B2 * | 6/2006 | Kellerman et al. | 73/25.04 |
| 7,175,105 B2 * | 2/2007 | Plecher et al. | 239/102.2 |
| 2001/0020416 A1 * | 9/2001 | Yoshikawa et al. | 95/45 |
| 2002/0090506 A1 * | 7/2002 | Protzner et al. | 428/334 |
| 2005/0120714 A1 * | 6/2005 | Schurz et al. | 60/533 |

FOREIGN PATENT DOCUMENTS

| | | |
|---|---|---|
| DE | 198 44 743 C1 | 1/2001 |
| DE | 102 51 225 A1 | 5/2004 |

\* cited by examiner

*Primary Examiner*—Darren Schuberg
*Assistant Examiner*—Derek Rosenau
(74) *Attorney, Agent, or Firm*—Baker Botts L.L.P.

(57) ABSTRACT

A seal (10) for a piezo-actuator of a fuel injector with terminal posts (12) projecting out of the piezo-actuator and a head arrangement (14) mounted on the piezo-actuator with openings (16) for passage of the terminal posts (12) is particularly suitable even for comparatively thin head plates. A sealing unit (18) mounted on the head arrangement (14) and provided with openings for passage of the terminal posts (12) is provided, having a support (22), on which a sealing material (26) is arranged, which is in contact in a sealing manner with the peripheral surfaces of the terminal posts (12) and a peripheral region of the head arrangement (14) and in which an element (20) made of microporous material is integrated to create gas permeability.

20 Claims, 6 Drawing Sheets

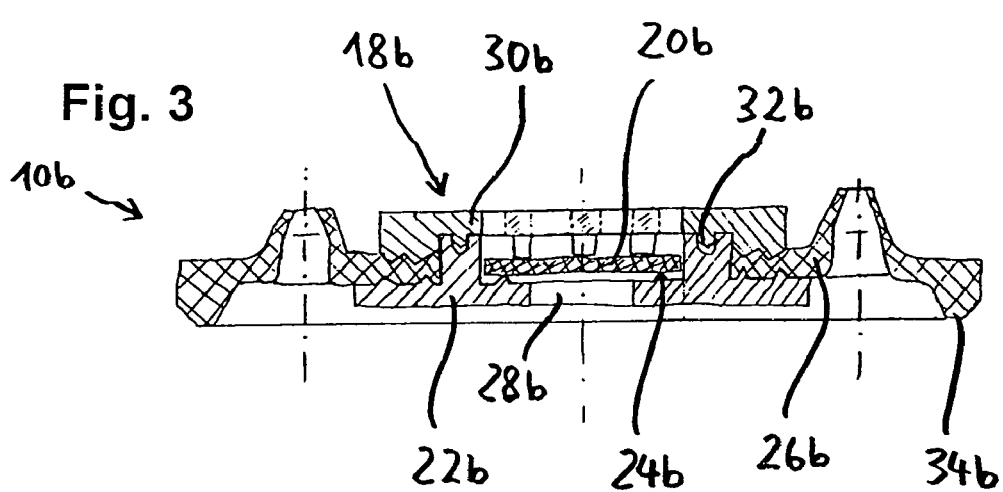
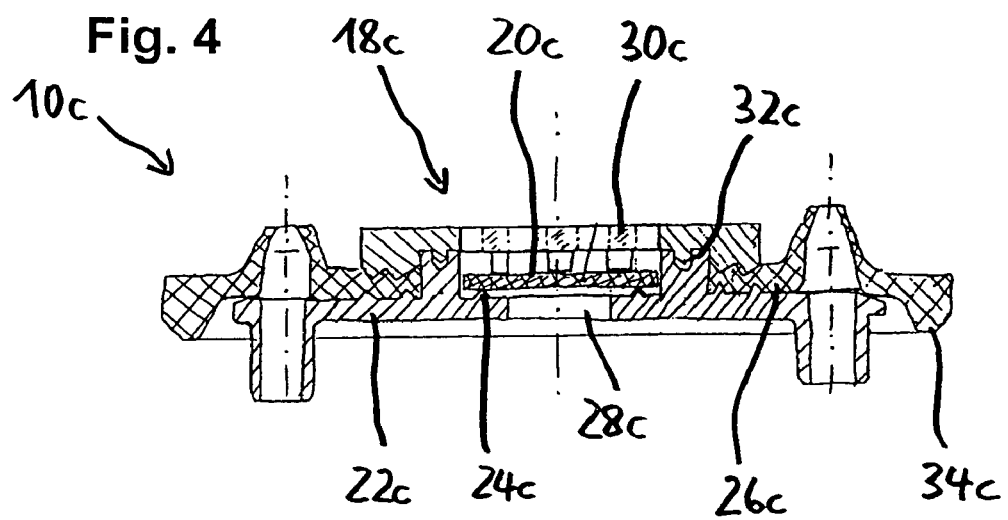

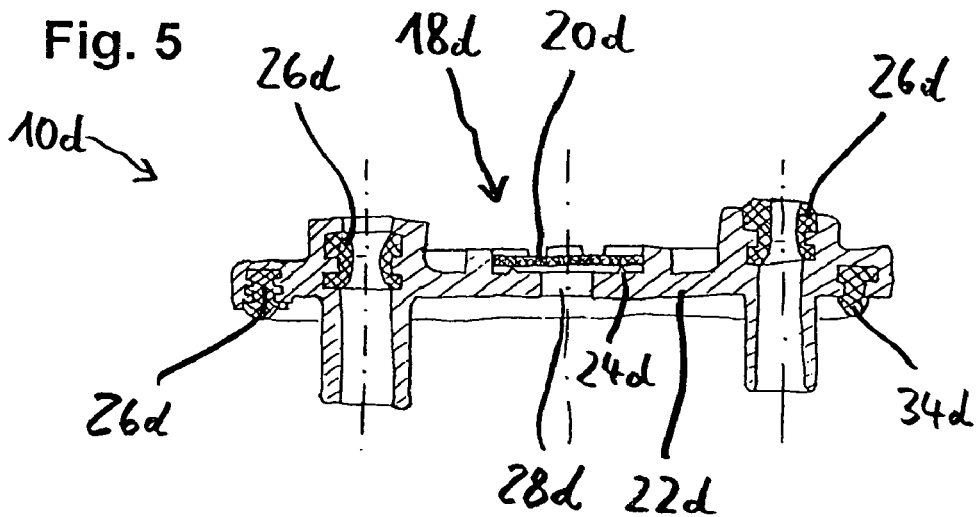
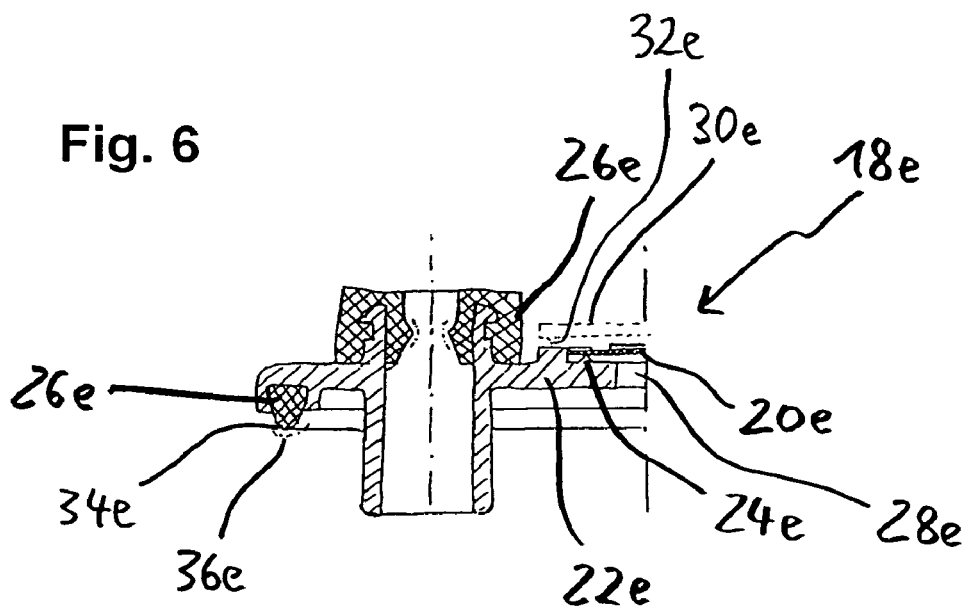

SEALING ARRANGEMENT FOR A PIEZO ACTUATOR OF A FUEL INJECTOR

PRIORITY

This application claims priority to U.S. Provisional Application 60/603,290 filed Aug. 20, 2004; German application no. 10 2004 040 491.7 filed Aug. 20, 2004; and, European application no. 04104652.5 filed Sep. 24, 2004.

TECHNICAL FIELD OF THE INVENTION

This invention relates to a sealing arrangement.

DESCRIPTION OF THE RELATED ART

Such an arrangement is for example known from DE 102 51 225 A1. With this prior art it is proposed that a fuel-resistant sealing ring (O ring) be inserted into every opening of a head plate mounted thereon to create a permanent, in particular oil-proof seal between a piezo-actuator and an external contact. A collar made of an insulating material is also inserted in every through opening below the sealing ring to center and provide electrical insulation for the terminal post.

One disadvantage of this known piezo-actuator contact is that it requires a comparatively thick head plate in order to be able to accommodate a sealing ring and a centering collar respectively in its through openings.

SUMMARY OF THE INVENTION

It is therefore one object of the present invention to develop a sealing arrangement of the aforementioned type such that a reliable seal is possible in particular even with comparatively thin head plates.

The sealing arrangement is characterized by a sealing unit mounted on the head arrangement and provided with openings to allow the passage of the terminal posts, having a support, on which a sealing material is arranged, which is in contact in a sealing manner with peripheral surfaces of the terminal posts and a peripheral region of the head arrangement, and in which an element made of microporous material is integrated to create gas permeability.

The sealing contact both with the peripheral surfaces of the terminal posts and the head arrangement allows a reliable seal. This seal is outside the structural space defined by the through openings, so that greater structural freedom exists irrespective of this structural space defined by the through openings and said seal is also particularly suitable for comparatively thin head plates.

As far as the assembly of a fuel injector is concerned, the invention advantageously allows a piezo-actuator provided with a plurality of terminal posts to be sealed by fitting a single component (sealing unit).

The greater structural freedom resulting from the seal outside the structural space defined by the through openings is further utilized according to the invention to create gas permeability by means of an element made of a microporous material integrated in the support.

A preferred use of the inventive sealing arrangement results for the piezo-actuator of a fuel injector in an internal combustion engine, in which the fuel injector and at least one further component of a fuel injection device are arranged essentially completely within an engine block module of the internal combustion engine. This relates in particular to the instance where components of the injection device are housed within the engine block module, which could also be arranged outside said module without impairing their function. The term "engine block module" here refers to all the components containing engine lubricating oil, i.e. the "engine block" in the narrower sense and mounted parts (e.g. a cylinder head cover, etc.) in which lubricating oil is pumped or smeared or fed (back). With such an engine structure there is an increased risk of the introduction of damaging media such as oil and/or fuel into the inner chamber of an injector housing. This problem is particularly acute for common rail diesel engines with injection components within the cylinder head cover.

Internal trials carried out by the applicant have surprisingly proven that the arrangement of a piezo-ceramic component, like the piezo-actuator of interest here, in "the most gas-proof possible" piezo-housing arrangement in an installation environment containing damaging media in practice does not extend the life of the component but tends rather to shorten it.

In contrast a certain "gas permeability" in the region of the sealing arrangement allows a significant extension of the durability or life of the piezo-actuator to be achieved. One possible explanation for this is that with the most gas-proof sealing possible of the piezo-housing a partial vacuum results in certain operating conditions inside the housing (e.g. due to temperature fluctuations), as a result of which damaging media can penetrate inside the housing through the seal, which cannot in practice be configured in a totally hermetic manner. Other possible explanations are for example that after production of a hermetically sealed piezo-drive the concentration of any life-shortening gas in the inner chamber of the piezo-drive increases or that a level inside the housing close to that of the atmospheric air has a positive effect on the life of the piezo-ceramic.

The inventive integration of the microporous material allows a certain gas permeability or pressure equalization capacity to be achieved on the part of the sealing arrangement, thereby having the advantageous effect of extending the durability or life of the piezo-actuator.

Integration of the permeable element in the support is preferably provided such that at least one gas exchange path results through the sealing unit, in which there is microporous material but no support material and no sealing material. This means that the gas exchange capacity of the sealing arrangement is essentially independent of the support material and the sealing material. The latter materials can then be selected such that they are particularly suitable for their respective tasks.

Plastic for example can be used as the material for the support.

The use of an elastomer is preferred for the sealing material, for example to achieve permanently tensioned sealing contact at the terminal posts and the head arrangement.

In a manner that is simple as far as production methods are concerned the sealing material can be configured for example as a molding around the support. Alternatively the sealing material arranged on the support can be supplied wholly or partially as a component in a twin-component injection molding method.

In one embodiment a close connection is created between the support and the sealing material by means of vulcanization.

In particular when the connection between the sealing material and the support does not provide a particularly good seal at the sealing unit as such, i.e. when these materials are simply in contact with each other for example at the sealing unit, it is preferable—at least in the installed state—for the sealing material to be compressed onto the support. Such compression can for example be achieved with the fuel injector in the assembled state by exerting pressure by means of what is known as a contact module, which results in connecting the terminal posts further electrically to an external contact (plug-in connector) of the fuel injector.

Compression of the sections of the sealing material which come into contact with the terminal posts (radial seal) and the section of the sealing material which comes into contact with the head arrangement (axial seal) has the further advantage that the sealing effect can be improved as a result.

The connection between the microporous material and the support material should also be as close as possible. In a preferred embodiment the element formed from the microporous material is therefore welded to the support. Such welding is for example suitable for integrating a gas exchange element made of ePTFE (expanded polytetrafluorethylene). This material has also proven very advantageous, in that it can be used to prevent "damaging media" such as fuel (diesel, petrol, etc.) or lubricants (e.g. engine oil) penetrating the actuator chamber, while volatile substances can diffuse out of the actuator chamber and air or oxygen can diffuse into the actuator chamber. Other microporous materials that could be used here are known to the person skilled in the art and therefore require no further explanation.

It is advantageous for a compact structure of the sealing arrangement, if the gas exchange element is essentially disk-shaped, for example configured as a diaphragm. Such a gas exchange disk can for example extend over the entire cross-section of a through opening of the sealing unit and be welded at the periphery to the adjacent material (e.g. support material) (e.g. by ultrasonic welding, laser welding, etc.). Alternatively the disk can also be inserted into such a through opening with a close fit with a sealing effect all round.

BRIEF DESCRIPTION OF THE DRAWINGS

The invention is described below using exemplary embodiments with reference to the accompanying drawings, in which:

FIG. 3 shows a sectional view of a sealing unit according to a further embodiment, FIG. 4 shows a sectional view of a sealing unit according to a further embodiment, FIG. 5 shows a sectional view of a sealing unit according to a further embodiment, FIG. 6 shows a detail from FIG. 5 in a modified embodiment.

DETAILED DESCRIPTION OF THE PREFERRED EMBODIMENTS

Figure 1:
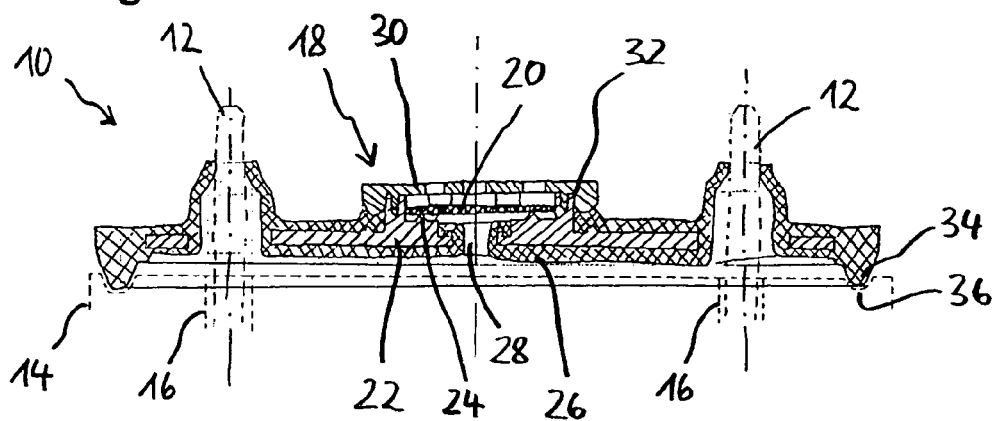
FIG. 1 shows a sectional view of a sealing unit.

FIG. 1 shows a sealing arrangement 10 for sealing a piezo-actuator (not shown), serving as a drive component of an actuator for a fuel injector in an internal combustion engine. Shown with a broken line in the Figure are terminal posts 12 projecting out of the piezo-actuator and a head arrangement 14 mounted on the piezo-actuator, which has holes 16 for passage of the terminal posts 12.

For a diesel injector of a common rail system integrated completely in a cylinder head of an internal combustion engine in particular a seal must be provided for the piezo-actuator, which seals the actuator chamber via the terminal post contact (to an electrical external connection) reliably against the penetration of fluids. Otherwise there is a risk that "damaging media" such as engine oil, engine oil diluted by fuel and water can penetrate the actuator chamber via a contact module providing the electrical further connection from the terminal posts 12 to the external contact. It has however proven that the greatest possible gas permeation of "volatile substances" from the actuator chamber and air or oxygen into the actuator chamber can tend to extend the durability or life of the piezo-actuator in the actuator chamber.

The required good fluid seal with simultaneous creation of gas permeability is achieved with the sealing arrangement 10 shown by fitting (inserting) a sealing unit 18 between the head arrangement 14 and the contact module (not shown).

The multipart sealing unit 18 premanufactured as an assembly component comprises three materials or sealing unit components closely connected to each other when the sealing unit is in its installed state, namely a microporous diaphragm 20 made of ePTFE, a support 22 made of plastic, to the periphery of which the microporous diaphragm 20 is welded (at 24) and a seal 26 (in one piece in the example shown) made of an elastomer. This elastomer, with which the sealing unit 18 on the one hand is in contact with the peripheral surfaces of the terminal posts 12 and on the other hand with a front peripheral region of the head arrangement 14 in a fluid-proof manner, obviates the need for a reliable seal against the penetration of damaging media from the environment of the fuel injector into the actuator chamber below the head plate 14.

During production of the unit comprising the support 22 and the sealing material 26, the support 22 is used as an insert in a molding process. This insert essentially extends over the entire radial extension of the finished seal 26.

Although it is possible to select an elastomer material with a high level of gas permeability (e.g. silicon or fluorosilicon material) to increase the gas permeability of the sealing arrangement 10, this is generally not necessary, for example in favor of optimized elastomer selection in respect of mechanical and thermal characteristics, as gas permeability is achieved by means of a specifically provided gas exchange passage through the sealing unit 18. In the example shown the sealing material 26 configured as the molding of the disk-shaped support 22 and the support itself have a gas exchange opening 28 in the center, in the (axial) outward course of which the gas-permeable diaphragm 20 is arranged with its periphery welded to the support 20.

The sealing unit 18 thereby provides a module that is simple to handle during assembly of a fuel injector, allowing a high level of permeation or diffusion of gaseous media and at the same time preventing penetration of fluid media.

The main task of the support 20 is to stabilize the sealing unit 18 mechanically, in particular in respect of the microporous diaphragm 20, which as a filter element is very susceptible to mechanical damage. As the support 22 is not essential for the sealing effect to be achieved, its material can be selected comparatively freely. In the example shown essential material requirements are simply the ability to be welded to the material of the diaphragm 20 and a good sealing effect at the interfaces between the support material and the sealing material 26.

For further stabilization and to protect the diaphragm 20 in the example shown a protective cover 30 is also provided, which is connected firmly to the support 22 by ultrasonic welding (at 32). The protective cover 30 configured here as a "protective screen" further stabilizes the support 22 and in the exemplary embodiment shown also has the function of exerting an axial pressure on material sections of the seal 26 in the mounted and welded state, so that a close and therefore effective sealing connection is maintained permanently between the seal 26 and support 22. Finally the protective cover 30 also protects the diaphragm 20 effectively in the event that the sealing unit 18 is integrated during the course of automated production of the fuel injector.

In so far as a protective effect against diaphragm damage (e.g. by means of the protective screen) is not necessary in the specific instance, the protective cover could alternatively be in the form of a compression ring, which also stabilizes and compresses the seal material 26.

If the diaphragm 20—as shown—is arranged in a collar-type, holding section of the support 22, open in a crenellated manner, the protective cover 30 could also be configured as solid (e.g. without screen openings), as ventilation of the outside of the diaphragm is already ensured at the side, through intermediate spaces between the crenellations of the support material.

The material of the seal 26 is elastically tensioned to lie against the peripheral surfaces of the terminal posts 12. This is achieved in that the seal 26 is made of an elastic material with openings for passage of the terminal posts 12 and each opening cross-sectional area is smaller than the cross-sectional area of the relevant terminal post section in the region of the radial seal when the seal 26 is in the relaxed state.

In the exemplary embodiment shown the reliable axial seal is achieved in that an annular projection ("sealing lip") 34, the bottom of which stands away, is pressed into an annular groove 36 in the head arrangement 14. This compression in the region of the axial seal is provided by the exertion of axial pressure from the contact module (not shown) to the electrical terminal of the fuel injector. The contact module presses at least sections of the seal 26 against the head arrangement 14, so that the seal sections subject to loading are clamped between the contact module and the head arrangement 14.

The elastomer material used for the seal 26 is electrically insulating. This choice of material means that no special precautions have to be taken against inadequate electrical insulation of the terminal posts 12 in the event that the head arrangement is electrically conductive. This is generally the case, as it is usually made of metallic materials. In the event that when the head arrangement 14 is electrically conductive, the material of the seal 26 is not electrically insulated to an adequate degree, the head arrangement can be electrically insulated, e.g. provided with an insulating layer or insulating component, at least in the regions where the seal 26 is in contact with the head arrangement 14. This insulating layer can for example be configured as an insulating disk (see FIG. 10 for example) as explained below, which extends almost to the peripheral region of the head arrangement 14 and also has openings for passage of the terminal posts 12. Such an insulating disk can advantageously be provided with collar extensions (e.g. formed as a single piece), which extend into holes 16 in the head arrangement 14, to insulate the terminal posts 12 there from the inner walls of said holes 16.

Figure 8:
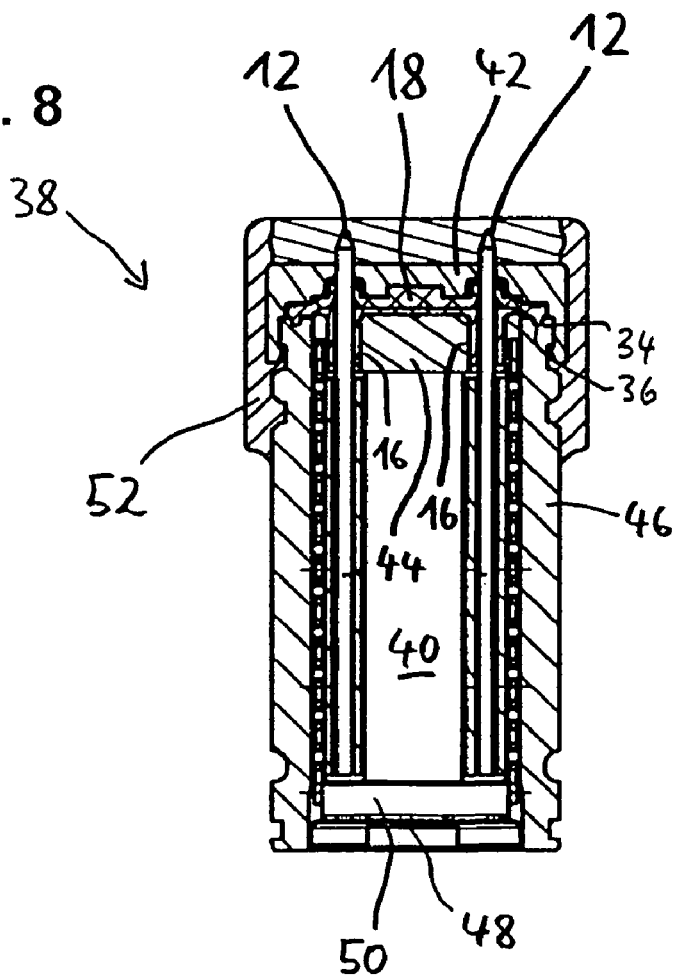
FIG. 8 shows a sectional view of an actuator for a fuel injector.

FIG. 8 shows the installation environment of the sealing unit 18 in an actuator 38 of the fuel injector.

In the known manner the actuator 38 comprises a piezo-actuator 40 essentially made up of a stack of piezo-elements and extending in an axial direction, the axial extension of which can be adjusted in a controlled manner by applying a control voltage via the metal terminal posts 12.

The electrical further connection of the terminal posts 12 to contact elements of an electrical external connection ("plug-in connector") is achieved by means of a contact element support welded to the ends of the terminal posts 12, which in the example shown forms the contact module 42. For the principles of such a contact element support, see for example DE 198 44 743 C1.

There is also a head plate 44 mounted on the piezo-actuator 40, which defines the actuator chamber together with a collar-shaped actuator housing 46 and a sealing diaphragm 48 welded to the lower end of the housing. Within said actuator chamber the piezo-actuator 40 is held by axial pressure in a tube spring, the lower end of which is welded to a base plate 50 inserted in the actuator housing 46 in such a manner that it can move axially. The piezo-actuator 40, the head plate 44, the tube spring and the base plate 50 form an actuator unit, which is inserted into the collar-shaped actuator housing 46 during assembly of the actuator 38. In the region of the diaphragm 48 an active connection is provided between the piezo-drive and a fuel injection valve in the known manner, to transfer the axial length change of the piezo-actuator 40 to an activation element of the injection valve.

It can be seen from FIG. 8 that the annular sealing lip projection 34 of the sealing unit 18 engages in the annular groove 36 formed at the upper end of the actuator housing 46 with a sealing effect (axial seal). This engagement facilitates assembly and prevents the sealing unit 18 slipping out of place, when it is compressed during assembly of the actuator 38 by the material sections of the contact module 42 provided for this purpose. Alternatively a different configuration of this interface between the axial seal material (projection 34) and the head arrangement 44, 46 could be provided for this purpose, perhaps with at least one offset or at least one non-flat interface region. Alternatively or additionally such a particular configuration can also be provided at the interface between the sealing unit 18 and the contact module 42. It is important that in the assembled state the lower side of the contact module 42 at least presses on the annular region of the axial seal, to ensure by means of said compression that the projection 34 is held particularly tightly in the groove 36. The sealing effect is ensured permanently due to the elasticity of the sealing material 26 used.

The contact module 42 encompasses a peripheral region of the actuator housing 46 and after pressure has been applied is held by a latched connection provided in said region. This can be provided for example with continuous latching or with individual latches distributed around the periphery.

During assembly of the actuator 38 the sealing unit 18 is mounted on sections of the terminal posts 12 projecting out of the holes 16. Compression is achieved by applying pressure and latching the contact module 42. The ends of the terminal posts are then welded to metal welding tabs on the contact module 42 provided for this purpose. The upper end of the actuator 38 is finally sheathed before or after this welding operation. This sheath is formed in the example shown by a final plastic molding 52 and has the advantage that the latched connection between the actuator housing 46 and the contact module 42 is secured.

In the description below of further exemplary embodiments the same reference characters are used for similar components, with a small letter in each instance to distinguish the embodiment. Essentially only the differences in respect of the already described exemplary embodiment(s) are examined and reference is thereby made specifically to the description of previous exemplary embodiments.

Figure 2:
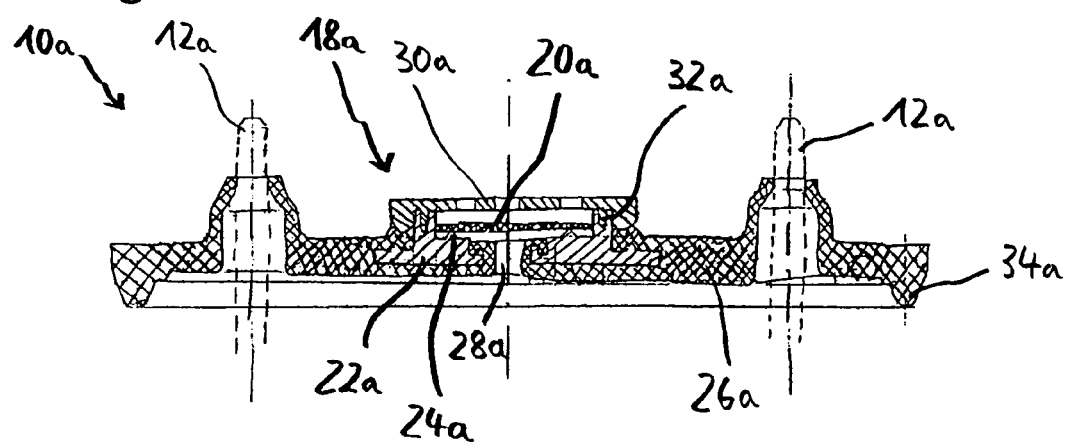
FIG. 2 shows a sectional view of a sealing unit according to a further embodiment.

FIG. 2 shows a sealing unit 18a, in which, unlike the embodiment described with reference to FIG. 1, a support 22a extends less far out in the radial direction. The support 22a again used as an insert in a molding process is only thereby located in the center of the finished seal 26a. This configuration in particular takes into account the fact that the stabilizing effect of the support 22a is significant primarily in the region of a diaphragm 20a made of microporous material. The cover 30 shown is optional.

FIG. 3 shows a sealing unit 18b, in which the connection between the elastomer material of a seal 26b and a support 22b is solely achieved by axial compression. The components support 22b, diaphragm 20b, seal 26b and support or protective cover 30b were produced in separate steps and then joined together. The connection between the support 22b and the protective cover 30b is again in the form of a permanent weld connection (e.g. ultrasonic welding (at 32b)). Compared with the embodiment according to FIG. 1 the protective cover 30b has a peripheral edge that projects radially further outward and presses the material of the seal 26b against the support 22b radially outside the weld 32b. The elastomer is hereby compressed peripherally against the edge of the cover, achieving a good sealing effect at the interface between the support 22b and the sealing material 26b. Here too the protective cover 30b could be configured as a simple compression ring, as long as there is no risk of diaphragm damage in the specific instance.

FIG. 4 shows a sealing unit 18c, in which unlike the embodiment according to FIG. 3 a support 22c extends radially further outward beyond the radial positions of the terminal posts and has openings in the region of the terminal posts for passage of the same.

A particular advantage of this embodiment is, as shown, that the support 22c can be configured with collar extensions the bottoms of which stand away and in the assembled state project into the through openings (holes) of the head arrangement, to insulate the terminal posts electrically from the inner walls of the through openings and/or to center them.

The configuration of the comparatively large support 22b with the collar extensions to a certain extent combines the support and the optional insulating disk of the embodiments described above.

FIG. 5 shows a sealing unit 18d, in which a support 22d represents a principal component, to which on the one hand a microporous diaphragm 20d is again fixed and on the other hand on which a sealing material 26d is essentially only provided at the "sealing points". Different such embodiments are shown on the left and right of FIG. 5 to illustrate different variants of the radial seal.

Unlike the embodiments described above, the individual sealing material sections therefore do not form a cohesive region but an annularly cohesive region for axial sealing and two separate material regions for sealing the terminal posts radially. The seal 26d is therefore configured in three parts and—as shown—is held on the support 22d in a positive manner.

The sealing material 26d was hereby produced by means of a twin-component injection molding method in one production step together with the support 22d, which is configured with downward projecting collar sections as in the embodiment according to FIG. 4.

For a close connection between the material sections of the seal 26d and the support 22d vulcanization for example could be provided for irrespective of any mechanical pressure.

A further option for configuring the positive fit between the seal and the support is shown in FIG. 6.

FIG. 6 shows a section of a sealing unit 18e corresponding to the left area of FIG. 5, in which unlike the embodiment according to FIG. 5 the sealing material 26e arranged on a support 22e for radial sealing encompasses the upper end of a collar extension standing away axially in an upward direction.

In the region of the radial seal a radial sealing bead is provided on the inner periphery of the corresponding material section of the seal 26e, which enhances the sealing effect by radial compression, when the sealing unit has been mounted on the terminal posts.

In the axial seal the positive connection between the support 22e and the corresponding sealing material section is achieved by a very small undercut, as shown.

With this variant in particular the subsequent fitting of premanufactured individual seals 26e for the radial seal would be a possible alternative to injection molding.

Figure 7:
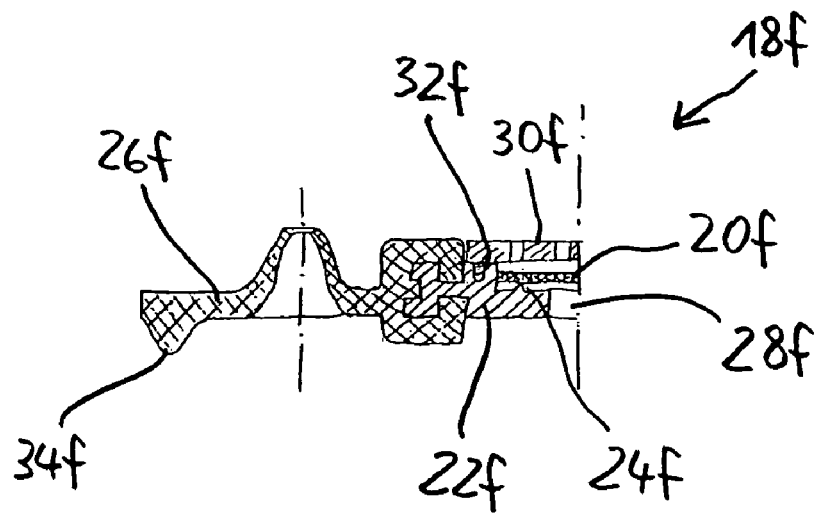
FIG. 7 shows a view corresponding to FIG. 6 according to a further embodiment.

FIG. 7 shows a view of a sealing unit 18f corresponding to FIG. 6, in which an essentially disk-shaped support 22f is encompassed by sealing material 26 on its outer periphery. The seal 26f is hereby configured as completely annular.

A further particularity of the embodiment according to FIG. 7 is that a close connection between the adjacent materials (support 22f, seal 26f) was achieved by "surface activation", here by vulcanization of the adjacent material surfaces. This measure means that subsequent pressing or compression of the material of the seal 26f against the support 22f (e.g. by means of the (optional) cover) is then not necessary.

All the sealing units described hitherto are suitable for an installation environment of the type shown in FIG. 8 and described above.

Figure 10:
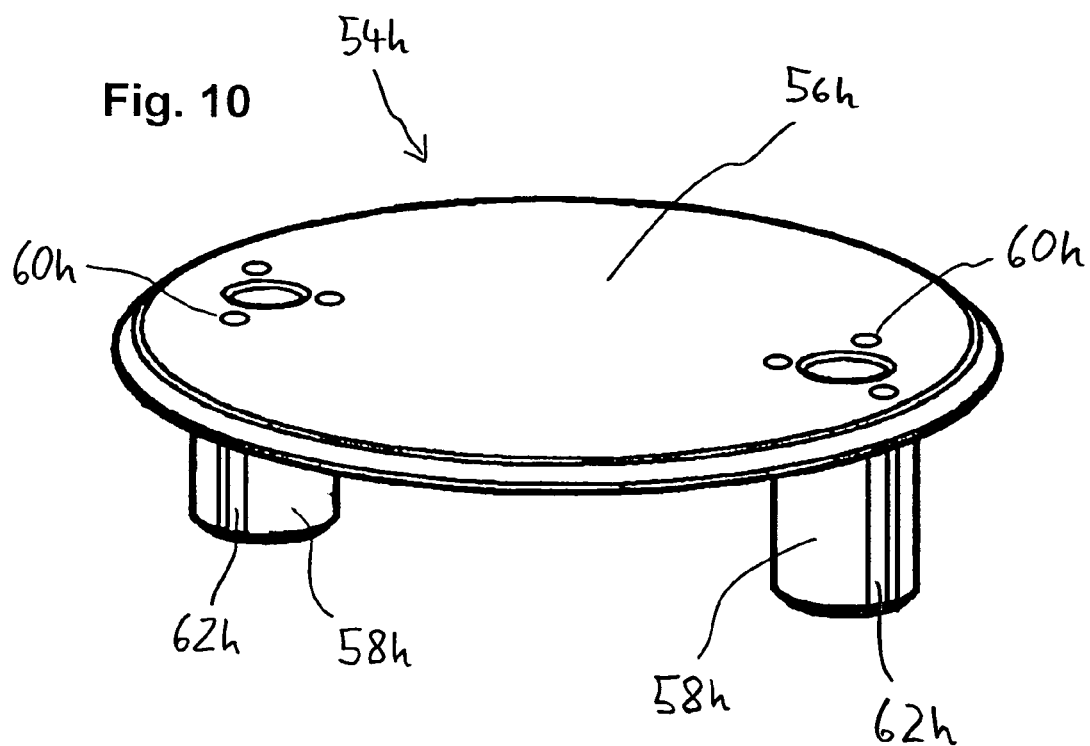
FIG. 10 shows a perspective view of an insulating disk.

In so far as with these embodiments the geometry on the underside of the sealing unit us configured for insertion of an insulating element between the sealing unit and the head arrangement, such an insulating element can for example be provided in the form of an insulating disk 54h, as shown in FIG. 10.

The insulating disk 54h shown in FIG. 10 comprises a disk body 56h to which collar extensions 58h are connected in a downward direction, through which in the assembled state the terminal posts of the piezo-actuator pass and which insulate said terminal posts from the head plate. In order to impair the gas exchange between the actuator chamber and the outside of the sealing unit as little as possible, ventilation holes 60h are provided, which assist the exchange of gas between the axially opposed sides of the insulating disk 54h.

In principle such ventilation openings 60h could be arranged at any point on the insulating disk 56h. For the best possible gas exchange capacity between the axially opposed front faces of the insulating disk 54h ventilation openings 60h should preferably be arranged—as shown—in the region of the collar extensions 58h. In particular in the region of the peripheral surface of the collar extensions 58h a gas exchange path is provided through the annular gap there into the actuator chamber. To improve the gas throughput along these peripheral surfaces further, axial ventilation grooves 62h are provided in the insulating disk 54h shown, each of which opens into one of the ventilation openings 60h.

Unlike the example shown according to FIG. 10 the ventilation openings 60h can also comprise one or a plurality of very large openings in the center of the insulating disk 54h. It is also advantageous for the purposes of increasing the effective actuator volume, if the insulating disk 54h is configured with large recesses (e.g. in the center) on one or both front faces.

Figure 9:
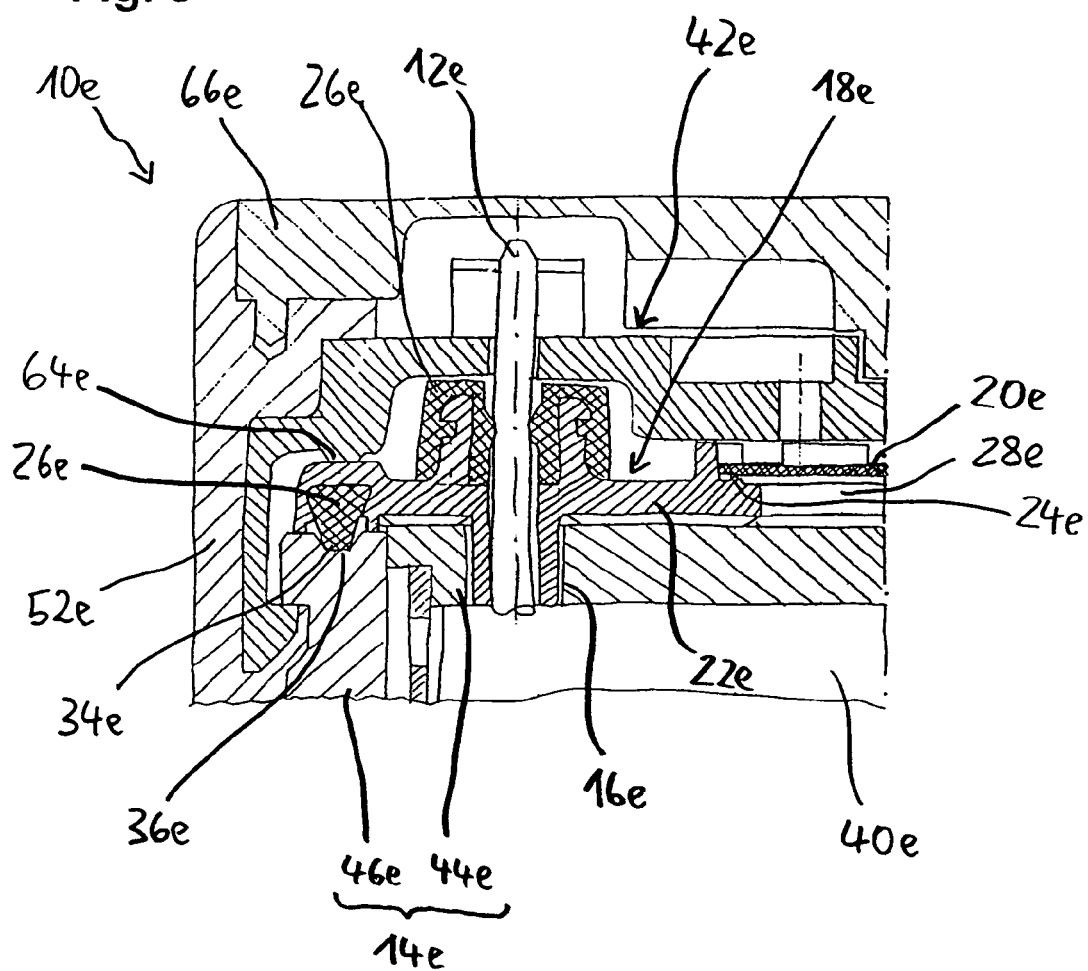
FIG. 9 shows a sectional view of a sealing unit according to a further embodiment.

FIG. 9 shows an exemplary installation environment of the sealing arrangement 10e in a fuel injector already described with reference to FIG. 6. It only shows the region around one of two terminal posts 12e. In the installed state the sealing unit 18e is subjected to axial loading along a peripheral region closed in an annular manner by a projection 64e of a contact module 42e, to ensure a reliable axial seal (engagement of sealing material projection 34e in the actuator housing groove 36e). During assembly of the fuel injector after said compression and production of the electrical further connection by means of the contact module 42e a final plastic molding 52e is undertaken to secure the attachment of the contact module 42e and finally a housing cover 66e made of plastic is fixed to the upper end of the structure by ultrasonic welding.

If the collar extension configured as one piece with the support 22e and standing away in a downward direction into the hole 16e is configured with a right-angled, e.g. square, outer profile, comparatively large ventilation gaps advantageously result between the collar extension and the inner wall of the hole 16e. To further increase gas permeability it is expedient, if the contact module 42e—as shown—has one or a plurality of further ventilation openings 63e (for example directly above the microporous element 20e).

With the embodiments described above the seal between the microporous membrane and its support is achieved by welding. Contrary to this example said seal could also be achieved in another manner.

With all the exemplary embodiments the integration of a diaphragm made of microporous material results in an increase in gas permeability, without impairing protection against the penetration of fluid media into the actuator chamber. As the gas exchangeability through a microporous element is achieved irrespective of the sealing material, the two materials can be selected independently of each other and therefore based on optimum function. Assembly of a fuel injector is significantly simplified by supplying a complete sealing unit, which can be fitted as an assembly component. The sealing unit allows good ventilation of the piezo-actuator and therefore an increase in the durability of the piezo-ceramic used for the purpose.

We claim:

1. A sealing arrangement for sealing a piezo-actuator of a fuel injector in an internal combustion engine comprising:
    terminal posts projecting out of the piezo-actuator,
    a head arrangement mounted on the piezo-actuator comprising openings for passage of the terminal posts, and
    a sealing unit mounted on the head arrangement comprising openings for passage of the terminal posts, wherein the sealing head comprises a support on which a sealing material is arranged which is in contact in a sealing manner with the peripheral surfaces of the terminal posts and with a peripheral region of the head arrangement and in which an element made of a microporous material is integrated to create gas permeability.

2. The sealing arrangement according to claim 1, wherein the support is made of plastic.

3. The sealing arrangement according to claim 1, wherein the sealing material is an elastomer.

4. The sealing arrangement according to claim 1, wherein the sealing material is configured as a molding around the support.

5. The sealing arrangement according to claim 1, wherein the sealing material is produced as a component in a twin-component injection molding method.

6. The sealing arrangement according to claim 1, wherein a close connection is created by vulcanization between the material of the support and the sealing material.

7. The sealing arrangement according to claim 1, wherein the sealing material is compressed towards the support.

8. The sealing arrangement according to claim 1, wherein the element made from the microporous material is welded to the support.

9. The sealing arrangement according to claim 1, wherein the microporous material is made of ePTFE.

10. The sealing arrangement according to claim 1, wherein the element made of microporous material is essentially disk-shaped.

11. A method for sealing a piezo-actuator of a fuel injector in an internal combustion engine wherein the piezo-actuator comprises terminal posts projecting out of the piezo-actuator, a head arrangement mounted on the piezo-actuator comprising openings for passage of the terminal posts, the method comprising the steps of:
    mounting a sealing unit on the head arrangement comprising openings for passage of the terminal posts, wherein the sealing head comprises a support;
    arranging a sealing material on the support which is in contact in a sealing manner with the peripheral surfaces of the terminal posts and with a peripheral region of the head arrangement, and
    integrating an element made of a microporous material into the sealing material to create gas permeability.

12. The method according to claim 11, wherein the support is made of plastic.

13. The method according to claim 11, wherein the sealing material is an elastomer.

14. The method according to claim 11, wherein the sealing material is configured as a molding around the support.

15. The method according to claim 11, wherein the sealing material is produced as a component in a twin-component injection molding method.

16. The method according to claim 11, further comprising the step of creating a close connection by vulcanization between the material of the support and the sealing material.

17. The method according to claim 11, wherein the sealing material is compressed towards the support.

18. The method according to claim 11, wherein the element made from the microporous material is welded to the support.

19. The method according to claim 11, wherein the microporous material is made of ePTFE.

20. The method according to claim 11, wherein the element made of microporous material is essentially disk-shaped.

* * * * *